(12) United States Patent
Shamir et al.

(10) Patent No.: US 6,465,804 B1
(45) Date of Patent: Oct. 15, 2002

(54) HIGH POWER BIPOLAR TRANSISTOR WITH EMITTER CURRENT DENSITY LIMITER

(75) Inventors: Nachum Shamir, Haifa (IL); Dan Ritter, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 0 days.

(21) Appl. No.: 09/613,693

(22) Filed: Jul. 10, 2000

(30) Foreign Application Priority Data

Jul. 12, 1999 (IL) ................................................ 130901

(51) Int. Cl.[7] .............................................. H01L 29/06
(52) U.S. Cl. .............................. 257/25; 257/46; 257/47; 257/197; 257/198; 438/170; 438/172; 438/312; 438/320; 438/571
(58) Field of Search .............................. 257/25, 46, 47, 257/197, 198, 477, 478, 479, 577, 580, 581; 438/170, 172, 312, 571, 370, 320, 342

(56) References Cited

U.S. PATENT DOCUMENTS

| | | | | | |
|---|---|---|---|---|---|
| 5,554,860 A | * | 9/1996 | Seabaugh | ...................... | 257/25 |
| 5,770,958 A | * | 6/1998 | Arai et al. | ................... | 327/114 |
| 5,920,231 A | * | 7/1999 | Ando | ........................ | 330/61 R |

* cited by examiner

*Primary Examiner*—Nathan J. Flynn
*Assistant Examiner*—Remmon R. Fordé
(74) *Attorney, Agent, or Firm*—Edward Langer

(57) ABSTRACT

A heterojunction bipolar transistor (HBT) having an emitter structure capable of reducing the current crowding effect and preventing thermal instabilities is disclosed, wherein a negative differential resistance. (NDR) element is added to the layer structure of the conventional emitter. In accordance with the invention, the NDR element can be implemented, for example, by a Resonant Tunnel Diode (RTD) or an Esaki Diode structure. The NDR element is designed to limit the tunneling current to the maximal emitter current density required for safe transistor operation, thereby also reducing the current crowding effect.

10 Claims, 5 Drawing Sheets

HIGH POWER BIPOLAR TRANSISTOR WITH EMITTER CURRENT DENSITY LIMITER

FIELD OF THE INVENTION

The present invention generally relates to heterojunction bipolar transistors (HBTs) for high power applications, and more particularly, to a heterojunction bipolar transistor having an emitter structure capable of reducing the current crowding effect and preventing thermal instabilities, wherein a negative differential resistance (NDR) element is added to the layer structure of the conventional emitter. The NDR element is designed to limit the tunneling current to the maximal emitter current density required for safe transistor operation.

BACKGROUND OF THE INVENTION

The effect of current crowding is a major obstacle in the operation of conventional bipolar power transistors. Due to the relatively large sheet resistance of the transistor base layer, the lateral conduction of the base current causes an ohmic voltage drop which reduces the effective forward bias applied to regions of the emitter junction away from the base contact, as described in the paper by J. R. Hauser, "The Effects of Distributed Base Potential on Emitter Current Injection Density and Effective Base Resistance for Stripe Transistor Geometries", *IEEE Transactions on Electron Devices*, ED 11, pp. 238–242, (1964). As the base current is increased, the lateral voltage drop becomes larger and the non-even distribution of the emitter current is increased.

The high density of the emitter and collector currents near the base contact causes significant localized heating. The elevated temperature causes an increase in the base collector junction leakage current, reduces the base emitter turn-on voltage, as described in the paper by R. H. Winkler, "Thermal Properties of High Power Transistors", *IEEE Transactions on Electron Devices*, ED14, pp. 260–263, (1967) and modifies the transistor gain. If the transistor current gain changes are small, a positive feedback effect is generated. If the current of the device is not limited by the external circuit, this thermal runaway can destroy the transistor, as described in B. G. Streetman, "Solid State Electronic Devices", 3rd ed., Prentice Hall, Englewood Cliffs, N.J., pp. 271–272, (1990).

A common solution to the current crowding effect is the fabrication of a multiple finger transistor made of several thin fingers that are connected in parallel. Such devices are used for high power and microwave applications, as described in S. M. Zee, "Physics of Semiconductor Devices", 2nd ed., Wiley, New York, pp. 165–166, (1981). Another advantage of this configuration is the improved high frequency operation due to the reduced effective base resistance.

However, when high power is applied to a multiple finger transistor the effects of thermal instability are exhibited, due to an uneven distribution of the current between the transistor fingers. These effects are described in the paper by H. F. Chau, W. Liu and E. A. Beam III, "InP Based HBTs and Their Perspective for Microwave Applications", 7th International Conference on Indium Phosphide and Related Materials, pp. 640–643, (1995), and the paper by W. Liu, H. F. Chau and E. Beam III, "Thermal Properties and Thermal Instabilities of InP Based Heterojunction Bipolar Transistors", *IEEE Transactions on Electron Devices*, 43, pp. 388–395, (1996). Also, the effect of the current gain collapse takes place, as described in the paper by W. Liu, S. Nelson, D. G. Hill and A. Khatibzadeh, "Current Gain Collapse in Microwave Multifinger Heterojunction Bipolar Transistors Operated at Very High Power Densities", *IEEE Transactions on Electron Devices*, 40, pp. 1917–1927, (1993), and the paper by W. Liu and A. Khatibzadeh, "The Collapse of Current Gain in Microwave Multi-finger Heterojunction Bipolar Transistors: Its Substrate Temperature Dependence, Instability Criteria and Modeling", *IEEE Transactions on Electron Devices*, 41, pp. 1698–1707, (1994).

The thermal instability occurs since the base collector leakage current increases and the transistor turn-on voltage decreases with the rise in temperature. The hottest finger gradually dominates the device operation by drawing higher portion of the total current. The increased current flow causes further heating and a destructive regenerative process is generated.

This thermal instability can be stabilized at the cost of an increased emitter resistance, by adding a stabilizing ballast resistor to each of the emitter fingers, as mentioned in the above-referenced book by S. M Zee (pp. 169–170). Another approach is the incorporation of a high resistance n-type layer in the emitter, as described in the patent by W. Liu and D. G. Hill, "Microwave heterojunction bipolar transistors with emitters designed for high power applications and method for fabricating same" European patent EP 0562272, (1993). It is important to note that high emitter resistance deteriorates the microwave performance of the device.

While it has been previously proposed to integrate a Resonant Tunnel Diode (RTD) in the emitter of bipolar transistors, for the purpose of multilevel logic design, its application in reducing the current crowding effect and preventing thermal instabilities has not been previously discussed. The known applications of RTD in a multilevel logic design are described in the paper by F. Capasso, S. Sen, A. Y. Cho and D. L. Sivco, "Multiple Negative Transconductance and Differential Conductance in a Bipolar Transistor by Sequential Quenching of Resonant Tunneling", Applied Physics Letters, 53, pp. 1056–1058, (1988), also in the paper by S. Sen, F. Capasso, A. Y. Cho and D. L. Sivco, "Multiple-State Resonant-Tunneling Bipolar Transistor Operating at Room Temperature and its Applications as a Frequency Multiplier", *IEEE Electron Device Letters*, 9, pp. 533–535, (1988), and in the paper by F. Capasso, S. Sen, F. Beltram, L. M. Lunardi A. S. Vengurlekar, P. R. Smith, N. J. Shah, R. J. Malik and A. Y. Cho, "Quantum Functional Devices: Resonant Tunneling Transistors, Circuits with Reduced Complexity, and Multiple-Valued Logic", *IEEE Transactions on Electron Devices*, 36, pp. 2065–2082, (1989).

Therefore, it would be desirable to provide a solution to the operational problems of high power bipolar transistors which are related to the current crowding effect and thermal instabilities.

SUMMARY OF THE INVENTION

Accordingly, it is a principal object of the present invention to overcome the problems associated with the high power operation of bipolar transistors, by proposing and demonstrating a modified emitter structure which includes a Negative Differential Resistance (NDR) element added to the emitter layers. The NDR element limits the emitter current density, reduces the current crowding effect in a large area device and prevents the thermal instabilities in multiple finger transistors. The modified emitter design demonstrates the reduction of the current crowding effect in a large area device and the self current limiting property of a small area device. Both properties can be used to enhance the high power performance of the transistor and prevent thermal instabilities in a multiple finger transistor configuration.

In accordance with a preferred embodiment of the invention, there is provided a bipolar transistor having improved high power performance by reduction of the current crowding effect, said transistor comprising:
- a substrate;
- a sub-collector layer;
- a collector layer;
- a base layer; and
- an emitter layer structure comprising a negative differential resistance element.

In a preferred embodiment, a resonant tunnel diode (RTD) or an Esaki diode is used as the negative differential resistance element. The maximal density of the forward tunneling current in a resonant tunnel diode (RTD) or an Esaki diode is determined by the device design. When such diode is added to the emitter of a bipolar transistor a composite device is formed where the maximal emitter current density is self-limited.

In a large area transistor, the limit on the emitter current density reduces the current crowding effect. This results from the fact that the peak concentration of the emitter current can not rise beyond the maximal tunneling current density of the diode.

In a small area device the total current is self-limited. Since a multiple finger transistor consists of a large number of small area devices connected in parallel and since each finger self-limits its total emitter current, the thermal instability is prevented. This is accomplished without adding ohmic resistance to all of the fingers (also called ballast resistors), thus reducing the total emitter resistance of the multiple finger transistor.

Since the current crowding effect is reduced, the size of each finger in a multiple finger transistor can be increased. Thus, the total number of fingers can be reduced and the transistor fabrication can be simplified.

Without limiting the scope of the invention, two types of NDR structures are discussed. In the first, an RTD is added to the emitter. The second structure consists of a forward biased Esaki diode, and a second, reversed biased Esaki diode, which is required to restore the conduction band current flow in a NPN transistor and valence band current flow in a PNP transistor.

In addition, a high resistance p-type layer can be grown between the two Esaki diodes used in a NPN transistor current limiter design. This layer can provide the emitter ballast resistance, forming a multiple finger transistor stabilizing mechanism which combines both standard ballast resistor and the disclosed NDR technique. Since the hole mobility is much smaller than the mobility of the electrons, the Ohmic resistance of p-type layers is larger than the resistance of an n-type layer with similar thickness and doping concentration. It is usually impractical to use standard n-type layers for providing the ballast resistance, due to the large thickness that is required. P-type layers, on the other hand, have larger resistance and the required layers are much thinner. P-type layers can be added to a standard emitter of a PNP transistor. In a NPN transistor, the use of an Esaki diode is required. The Esaki diode converts the conduction band current flow to the valence band current flow, making the integration of p-type layers possible.

Additional features and advantages of the invention will become apparent from the following drawings and the description.

BRIEF DESCRIPTION OF THE DRAWINGS

For a better understanding of the invention with regard to the embodiments hereof, references are made to the accompanying drawings, in which like numerals designate corresponding elements or sections throughout, and in which.

DETAILED DESCRIPTION OF THE PREFERRED EMBODIMENTS

General Description

Figure 1:
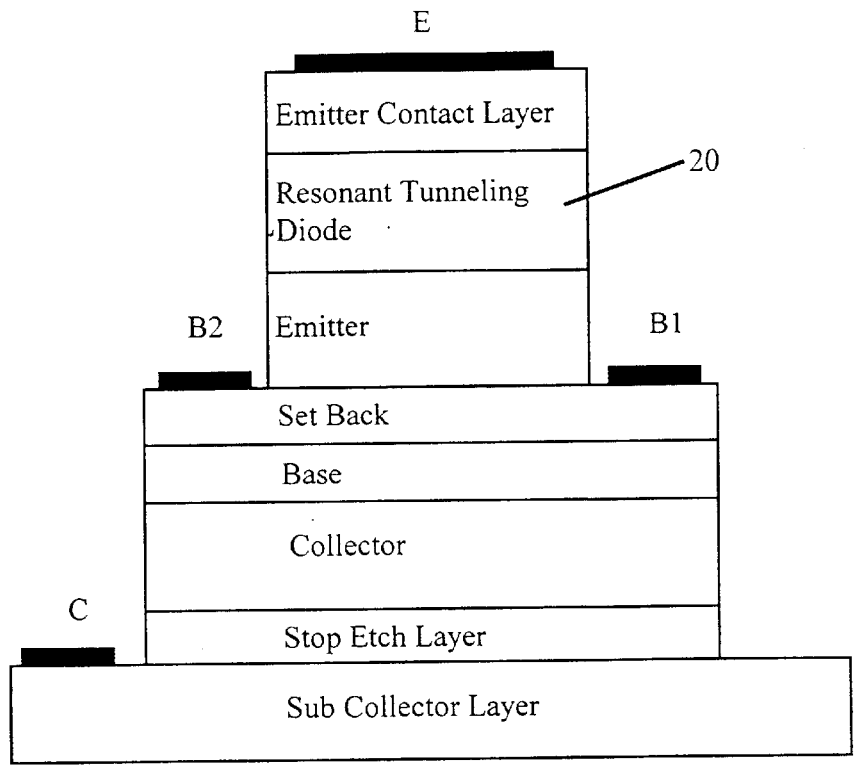
FIG. 1 is a schematic view of the structure of an HBT with RTD emitter current density limiter.

With reference to FIG. 1, an HBT with a monolithically integrated RTD 20 is illustrated. The maximal tunneling current density of the RTD is determined by the design of the RTD. The RTD tunneling current equals to the emitter current density. This structure can be applied to both NPN and PNP bipolar transistors.

Figure 2:
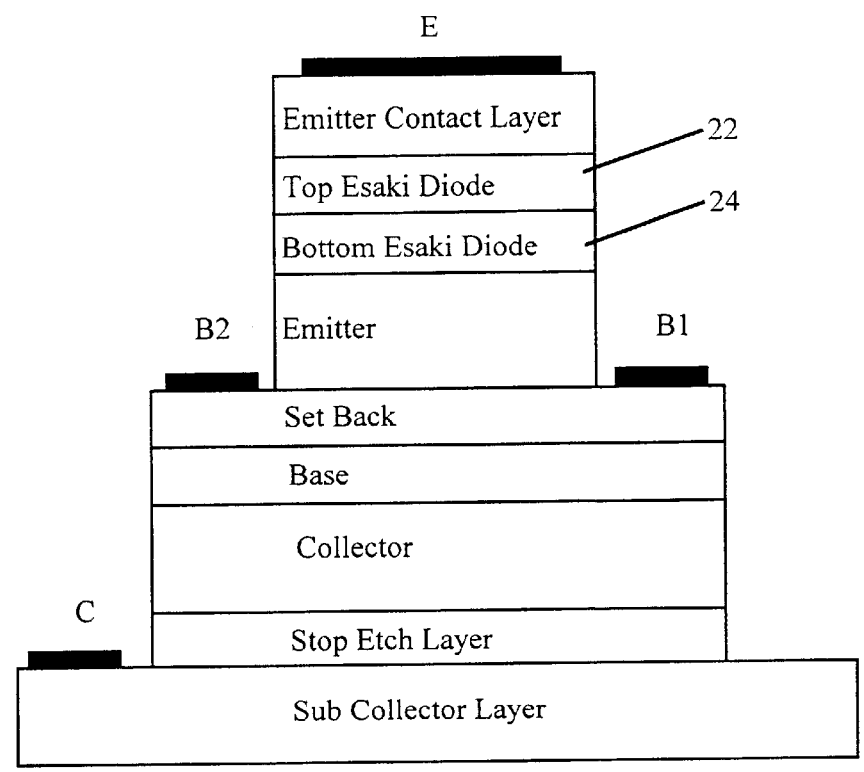
FIG. 2 is a schematic view of the structure of an HBT with an Esaki diode pair emitter current density limiter.

With reference to FIG. 2, an HBT with a monolithically integrated Esaki diode pair is described. The maximal forward tunneling current density of the top Esaki diode 22 is determined by the layer bandgap and doping levels. The top diode 22 forward tunneling current equals to the emitter current density. The bottom Esaki diode 24 operates in the reverse breakdown regime and is used to restore conduction band current flow in a NPN transistor design or the valence band current flow in a PNP transistor design. This structure can be applied to both NPN and PNP bipolar transistors.

Figure 3:
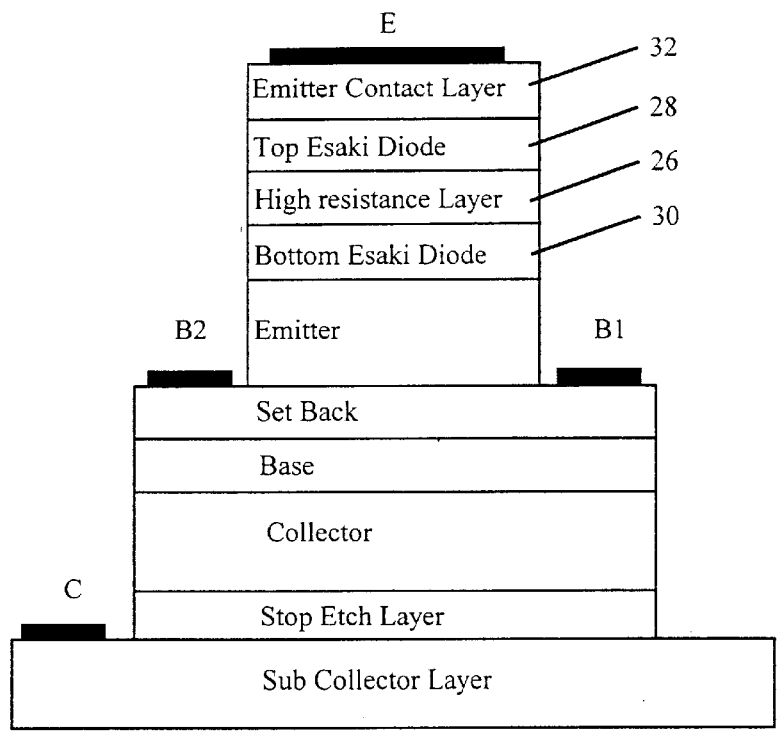
FIG. 3 is a schematic view of the structure of a NPN HBT with an Esaki diode pair emitter current density limiter and p-type high resistance layer.

With reference to FIG. 3, a NPN HBT with a monolithically integrated Esaki diode pair is described wherein a high resistance p-type layer 26 is added between the top 28 and bottom 30 Esaki diodes. The maximal emitter current density is determined by the top diode 28. The bottom Esaki diode 30 operates in the reverse breakdown regime and is used to restore conduction band current flow. The high resistance p-type layer 26 adds ballast resistance to the emitter. If only ballast resistance is required for a particular application, the emitter contact layer 32 and the top Esaki diode 28 can be omitted from the transistor design.

Figure 4:
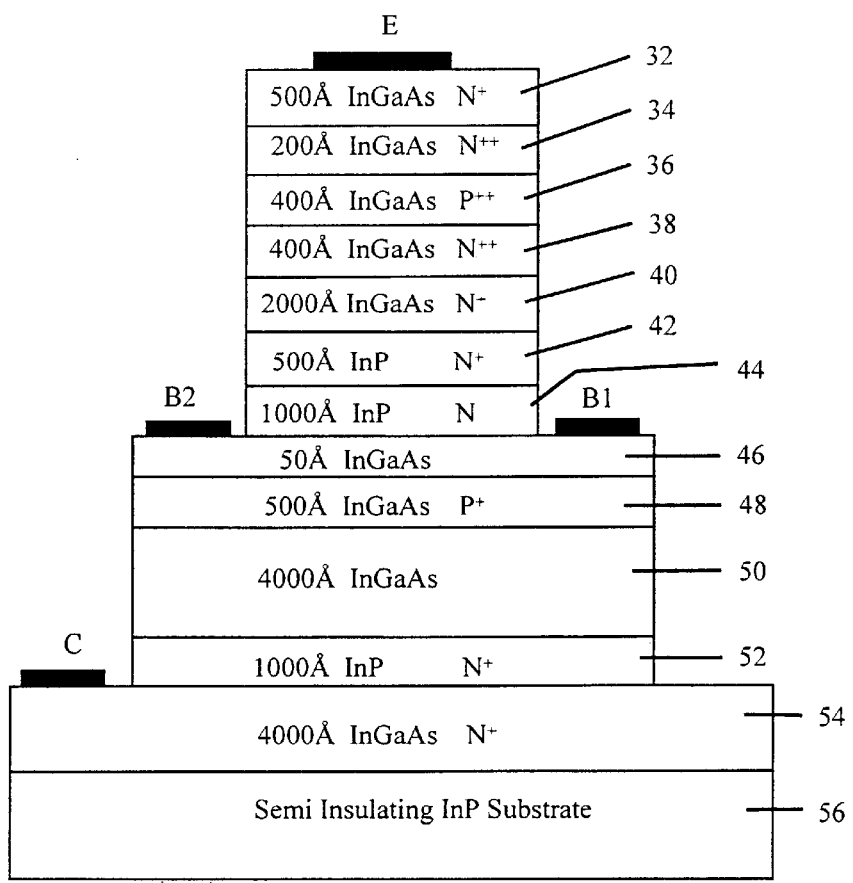
FIG. 4 is a detailed view of the layer structure of an HBT with an Esaki diode pair emitter current density limiter.

With reference to FIG. 4, the layer structure of the tested NPN HBT with Esaki diode pair is presented. It corresponds to the general device design presented at FIG. 2 and includes a standard NPN InP/InGaAs HBT and a pair of Esaki diodes. All the layers described in FIG. 4 are grown lattice matched to InP. Layer 32 is the emitter contact layer. The top Esaki diode is the junction between layers 34 and 36, and the bottom Esaki diode is the junction between layers 36 and 38. As can be seen in FIG. 4, both Esaki diodes share a common P++ layer, which is layer 36. The 2000Å thick InGaAs layer 40 is the second emitter contact layer. It was grown to function as the emitter contact layer after the removal of the Esaki diodes (layers 32, 34, 36 and 38) by a non-selective wet etching. By removing the Esaki diodes (layers 32, 34, 36 and 38) from half of the sample, a test set of standard HBTs was fabricated. This allowed the comparison between transistors with and without the emitter current density limiter structure.

Layers 42 and 44 in FIG. 4 are the wide bandgap emitter of the HBT and layer 46 is the base set-back layer, which is grown to prevent diffusion of the base dopants into the emitter. The base of the transistor is layer 48 and the collector is layer 50. Layer 52 is the collector stop-etch layer, grown to allow selectivity during the collector etching. Layer 54 is the sub-collector. The transistor was grown on a semi insulating, Fe doped, InP substrate (layer 56).

Esaki Diode Pair Electrical Characterization

Figure 5:
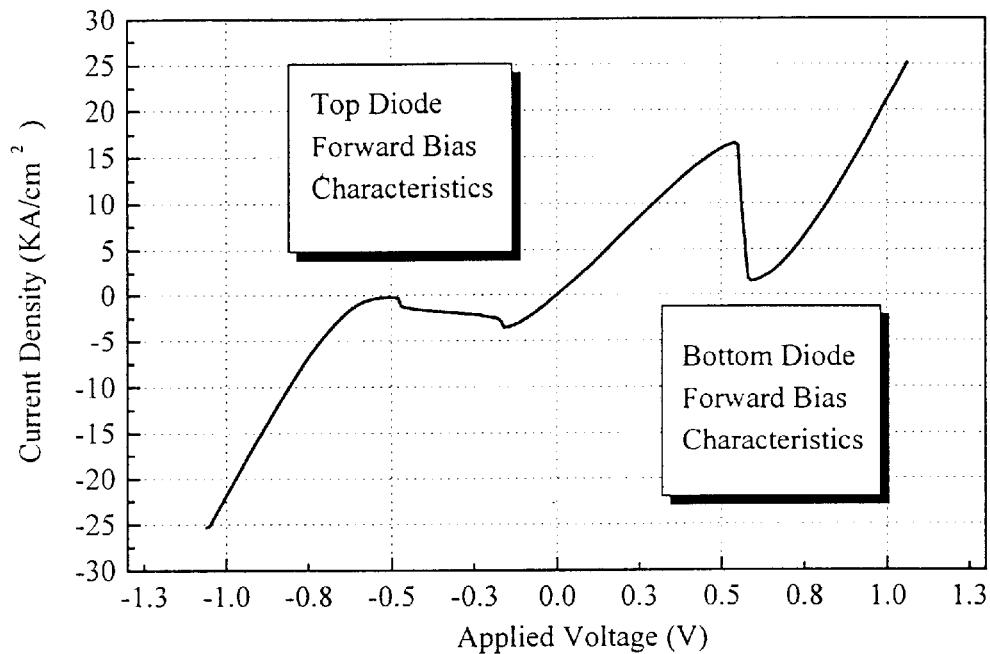
FIG. 5 is a graph of the current/voltage characteristics of the Esaki diode pair.

The current/voltage characteristics of the Esaki diode pair is displayed in FIG. 5 where the calculated current density is plotted versus the applied external bias level. During the electrical measurement the GND contact was connected to layer 40 (in FIG. 4) and the voltage source to layer 32 (in FIG. 4). When positive external bias was applied to layer 32 with respect to layer 40, the top diode was reverse biased and operated at the Zener breakdown regime. The current was limited by the forward bias characteristics of the bottom diode. For negative external biasing of layer 32 with respect to layer 40 the bottom diode was reverse biased and operated at the Zener breakdown regime. The current was limited by the forward bias characteristics of the top diode. The later case represents the current polarity, which is relevant to the active region operation of the NPN HBT.

The maximal tunneling current densities obtained for the top and bottom diodes were 3.5 and 17 KA/cm$^2$ respectively. The difference in peak current densities is explained by different doping levels at the top and bottom junctions. It is important to note that under a proper growth parameters optimization, peak tunneling current density of 93 KA/cm$^2$ has been demonstrated in InGaAs Esaki diodes, as described in the paper by G. M. Cohen, D. Ritter and C. Cytermann, "High Peak Tunnel Current Density Ga$_{0.47}$In$_{0.53}$ As Esaki Diodes", Electronics Letters, 31, pp. 1511–1512, (1995). This gives a wide current density range to the design of the emitter current limiter.

Current Crowding in Large Area Devices

Standard electrical characterization measurements were performed on the two sets of large area transistors. Within the safe operation range similar characteristics were seen at the active terminals of the devices (terminals E B1 and C in FIG. 4), and a difference in the measured voltage was observed at the inactive base terminal (terminal B2 in FIG. 4). The devices were operated in a Gummel plot measurement configuration and the voltage at the active and inactive base terminals (terminal B1 and B2 in FIG. 4 correspondingly), $V_{B1}$ and $V_{B2}$, was measured as a function of the total base current $I_B$.

Since no current flows between the emitter edge and the inactive base contact (terminal B2 in FIG. 4), $V_{B2}$ is identical to voltage at the emitter edge. In accordance with the formulas presented in the references V. Fournier, J. Dangla and C. Dubon-Chevallier, "Investigation of Emitter Current Crowding Effect in Heterojunction Bipolar Transistors", Electronics Letters, 29, pp. 1799–1800, (1993), and E. Dubois, P. H. Bricout and E. Robilliart, "Extraction Method of the Base Series Resistance in Bipolar Transistors in Presence of Current Crowding", IEEE Journal of Solid State Circuits, 31, pp. 132–135, (1996), the effective base resistance of the transistor can be calculated by:

$$R_{Beff} = \frac{V_{B2} - V_{B1}}{I_B} \tag{1}$$

The effective base resistance calculated according to Eq.1 includes the contact and lateral layer resistance, in addition to the effective resistance of the active transistor base area. In order to evaluate the constant excess resistance, a TLM measurement was performed per the method described in the paper by G. K. Reeves and H. B. Harrison, "Obtaining the Specific Contact Resistance From Transmission Line Model Measurements", IEEE Electron Device Letters, EDL3, pp. 111–113, (1982). The contact resistance and base layer sheet resistance were calculated.

Figure 6:
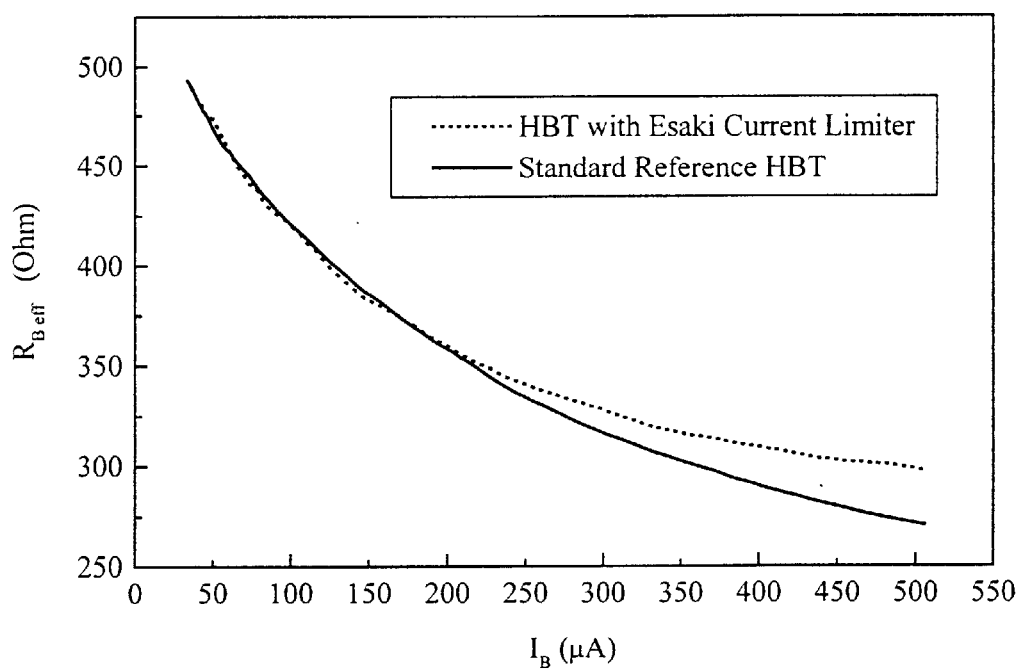
FIG. 6 is a comparison of the effective base resistance measured in a standard large area HBT and an HBT with an Esaki diode pair emitter current density limiter.

In FIG. 6, the corrected effective base resistance results are presented as a function of the total base current. At low currents, the current crowding effect was small and therefore the emitter current density did not exceed the level allowed by the Esaki diode limiter, and similar effective resistance values were obtained for both sets of transistors. However, when the total current was increased, the current crowding effect increased the emitter current density near the active base contact. This reduced the effective base size and the effective resistance was reduced accordingly. The higher effective resistance values obtained for the HBT with the Esaki diode limiter prove that the current crowding effect was reduced by the limiter.

Thermal Runaway in Large Area Devices

In high power operation of a bipolar transistor, uniform power dissipation is essential to preserve the even temperature of the device. If areas of the device overheat, the effect of thermal runaway can occur, resulting in the concentration of the entire current to a small area of the device.

The proposed emitter current density limiter described in FIG. 1, FIG. 2 or FIG. 3 can prevent the destruction of the device by designing the Esaki diode or RTD to allow maximal tunneling current density within the safe operation conditions of the transistor. We demonstrate the improved safe operation range using the transistors described in FIG. 4.

In NPN HBTs of the InGaAs type, the common emitter avalanche breakdown occurs at low bias levels, which can not cause the thermal runaway effect in a large area device. The thermal runaway effect was therefore demonstrated in a common base configuration. Due to the high ionization rate of electrons in InGaAs the base current polarity was reversed and the current crowding effect caused high current concentration away from the active base contact, as described in E. Zanoni, E. F. Crabbe, J. M. C. Stork, P. Pavan, G. Verzellesi, L. Vendrame and C. Canali, "Extension of Impact Ionization Multiplication Coefficient Measurements to High Electric Fields in Advanced Si BJT's ", IEEE Electron Device Letters, 14, pp. 69–71, (1993).

The localized temperature rise, which was caused by the current crowding, increased the base collector junction leakage current, which was multiplied by the impact ionization at the collector. The electron ionization rate in InGaAs was also increased in elevated temperatures, as described in the references D. Ritter, R. A. Hamm, A. Feygenson and M. B. Panish, "Anomalous Electric Field and Temperature Dependence of Collector Multiplication in InP/ Ga$_{0.47}$In$_{0.53}$As Heterojunction Bipolar Transistors", *Applied Physics Letters*, 60, pp. 3150–152, (1992), and N. Shamir, D. Ritter and C. Cytermann, "Beryllium Doped InP/InGaAsP Heterojunction Bipolar Transistors", *Solid State Electronics*, 42, pp. 2039–2045, (1998), and a regenerative process was obtained. Once the thermal runaway begun, the collector current was no longer influenced by the emitter current, and could not be limited by the Esaki diode.

Figure 7:
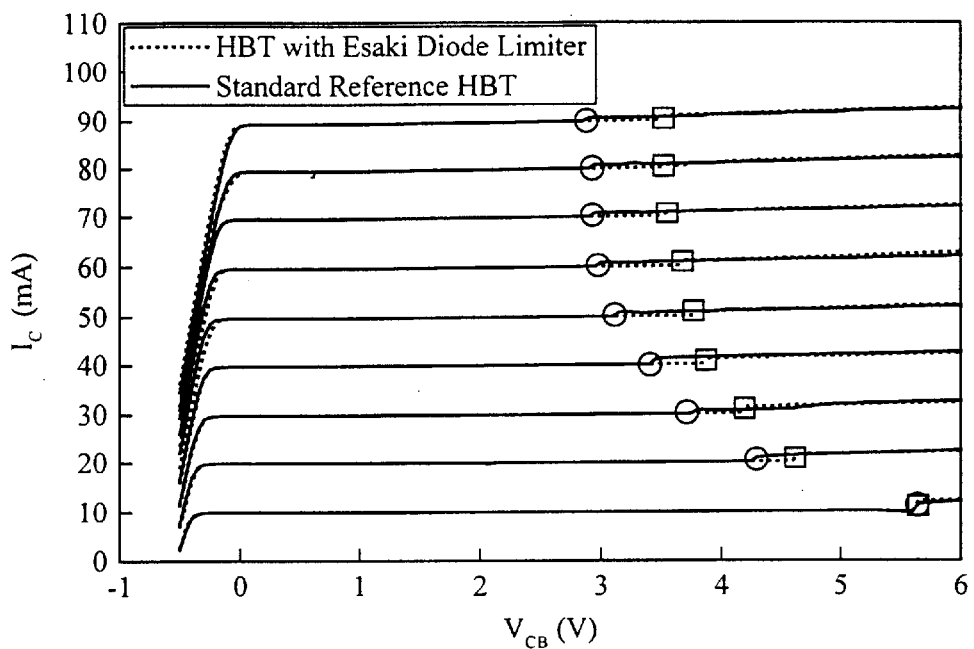
FIG. 7 is a comparison of the thermal runaway breakdown locations measured in a standard large area HBT and an HBT with an Esaki diode pair emitter current density limiter.

In FIG. 7, there are presented results obtained by destructive common base measurements performed on the two types of transistors. The thermal runaway locations of the HBTs with Esaki diode limiter and reference standard HBTs are marked by squares and circles correspondingly. The damage to the transistors resulted in a drastic and permanent increase in the base collector leakage current.

Due to the reduced current crowding effect in the transistors with the Esaki limiter, the localized heating effect was significantly reduced and thermal runaway occurred at higher power levels. These results successfully demonstrated the ability to control the power dissipation profile of a large area HBT by an emitter current density limiter design.

Self Limiting of the Emitter Current in Small Area Devices

In a small area device the current crowding effect can be neglected and the maximal emitter current density limit introduced by the limiter design described in FIG. 1, FIG. 2 or FIG. 3 can be treated as a total emitter current limit. In this configuration the small area transistor self-limits its total emitter current.

Figure 8:
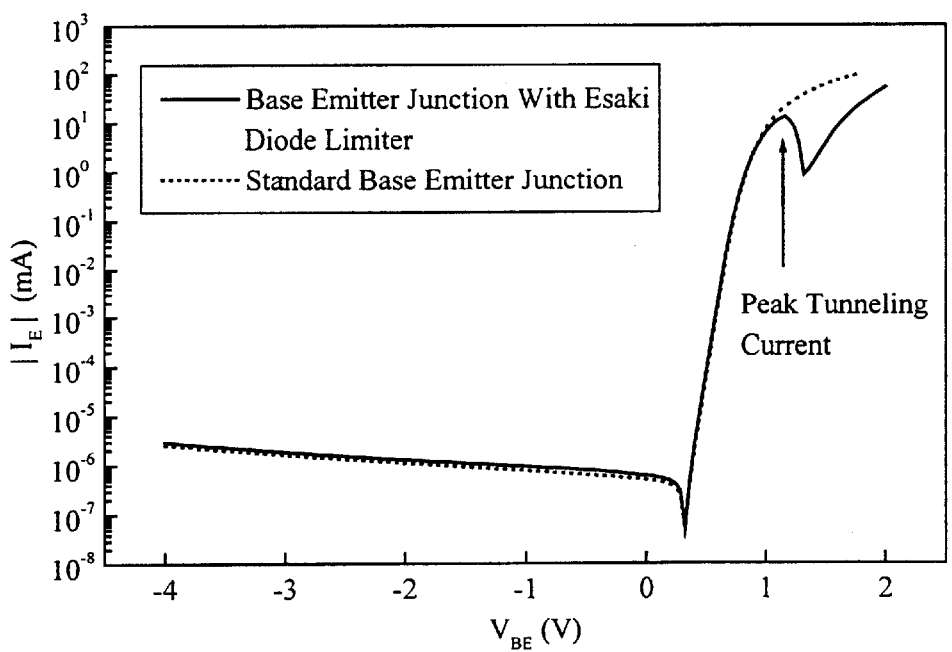
FIG. 8 is a comparison of the base emitter current-voltage characteristics measured in a standard small area HBT and an HBT with an Esaki diode pair emitter current density limiter.
Figure 9:
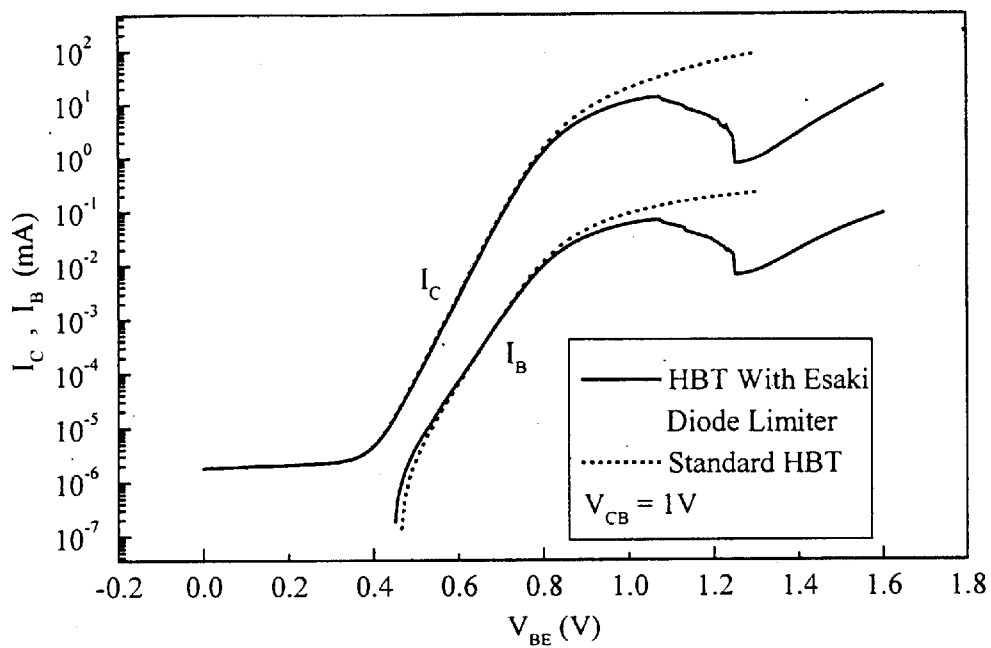
FIG. 9 is a comparison of the Gummel plot characteristics measured in a standard small area HBT and an HBT with an Esaki diode pair emitter current density limiter.

Standard electrical characterization measurements were performed on the two sets of transistors. For the transistors with the Esaki diode limiter, a Negative Differential Resistance (NDR) region was observed in the base emitter current voltage curves in FIG. 8 and the Gummel plot measurements in FIG. 9. As the emitter current exceeded the peak tunneling current, the top Esaki diode conduction was significantly reduced. A further increase of the emitter current was allowed only at higher bias levels, where both the base emitter junction and the top Esaki diode operated in a standard forward bias regime.

In order to evaluate the self-limiting operation of a small area transistor it was operated in common emitter configuration where the base terminal was connected to a voltage source. These operation conditions represent the actual conditions of a single finger of a multiple finger bipolar transistor.

Figure 10:
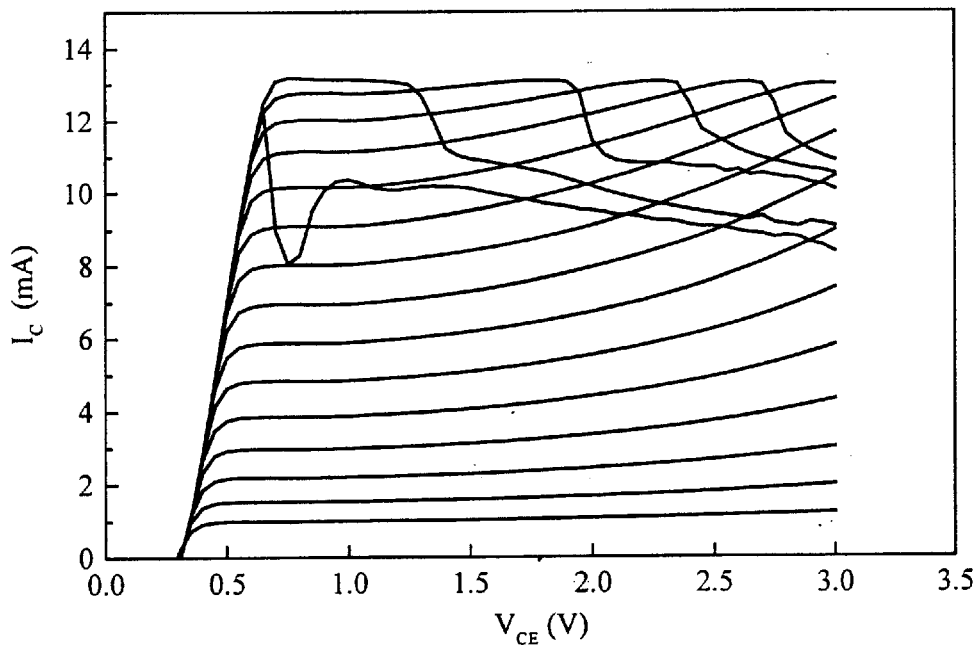
FIG. 10 is the Common Emitter characteristics measured in a small area HBT with an Esaki diode pair emitter current density limiter.

Each collector current curve in FIG. 10 was measured as a function of the collector emitter voltage for a constant base emitter voltage. The self-limiting operation is clearly observed in FIG. 10.

Having described the invention with regard to certain specific embodiments thereof, it is to be understood that the description is not meant as a limitation, since further embodiments may now suggest themselves to those skilled in the art, and it is intended to cover such modification as fall within the scope of the appended claims.

We claim:

1. A bipolar transistor having improved high power performance by reduction of the current crowding effect, said transistor comprising:
   a substrate;
   a sub-collector layer;
   a collector layer;
   a base layer; and
   an emitter layer structure comprising a negative differential resistance (NDR) element having operating characteristics including a tunneling current which is below its maximum possible value, said NDR element insuring transistor operation in a thermally stable fashion by limiting its maximal emitter current density and reducing the current crowding effect.

2. The transistor of claim 1 wherein said negative differential resistance element comprises a vertical integration of top and bottom back-to-back Esaki diodes grown on top of said bipolar transistor emitter and whose junction doping levels and material bandgap are optimized to reduce the current crowding effect by limiting said diode tunneling current to said limited maximal emitter current density.

3. The transistor of claim 1 wherein said negative differential resistance device comprises a resonant tunnel diode vertically integrated to said emitter and whose quantum layer structure is optimized to reduce the current crowding effect by limiting the diode tunneling current to said limited maximal emitter current density.

4. The transistor of claim 1 having a safe operation range which is increased above a normal operation range before the onset of a thermal runaway.

5. The transistor of claim 1 wherein said layers define a structure comprising a finger, and wherein a plurality of said fingers are connected in parallel in a multi-finger structure, wherein a predetermined power dissipation level can be handled by a group of fewer and wider ones of said fingers in relation to current crowding limitations of a standard multi-finger transistor.

6. The transistor of claim 2 having improved high power performance by immunity to thermal instabilities wherein said layers define a structure comprising a finger, and wherein a plurality of said fingers are connected in parallel in a multi-finger structure, wherein each finger has a self-limited total emitter current.

7. The transistor of claim 3 having improved high power performance by immunity to thermal instabilities wherein said layers define a structure comprising a finger, and wherein a plurality of said fingers are connected in parallel in a multi-finger structure, wherein each finger has a self-limited total emitter current.

8. The transistor of claim 6 configured as an NPN bipolar transistor with a high resistance p-type layer, grown between said two Esaki diodes, said high resistance layer providing a ballast emitter resistance.

9. The transistor of claim 8 wherein said top Esaki diode is omitted and said ballast emitter resistance is provided by said high resistance p-type layer, grown on top of said bottom Esaki diode.

10. A method of designing a high current semiconductor device comprising the steps of:
    determining an upper limit of current density for safe operation of the semiconductor device, to avoid unstable current conditions; and
    designing a negative differential resistance (NDR) element for monolithic integration with the semiconductor device, to limit the maximal current density within said upper limit.

* * * * *